(12) United States Patent
Chen et al.

(10) Patent No.: US 11,493,536 B2
(45) Date of Patent: Nov. 8, 2022

(54) PROBE HEAD WITH LINEAR PROBE

(71) Applicant: MPI Corporation, Chu-pei (TW)

(72) Inventors: Tzu-Yang Chen, Chu-pei (TW); Chin-Yi Lin, Chu-pei (TW); Chen-Rui Wu, Chu-pei (TW); Sheng-Yu Lin, Chu-pei (TW); Ming-Ta Hsu, Chu-pei (TW); Chia-Ju Wei, Chu-pei (TW)

(73) Assignee: MPI CORPORATION, Chu-Pei (TW)

( * ) Notice: Subject to any disclaimer, the term of this patent is extended or adjusted under 35 U.S.C. 154(b) by 0 days.

(21) Appl. No.: 17/329,465

(22) Filed: May 25, 2021

(65) Prior Publication Data
US 2021/0373048 A1  Dec. 2, 2021

(30) Foreign Application Priority Data

| May 26, 2020 | (TW) | ................................. | 109117444 |
| May 26, 2020 | (TW) | ................................. | 109206477 |
| Sep. 28, 2020 | (TW) | ................................. | 109133701 |
| Mar. 22, 2021 | (TW) | ................................. | 110110267 |

(51) Int. Cl.
*G01R 1/067* (2006.01)

(52) U.S. Cl.
CPC .................................. *G01R 1/0675* (2013.01)

(58) Field of Classification Search
CPC ............. G01R 1/0675; G01R 1/06733; G01R 1/06722; G01R 1/06; G01R 1/067; G01R 1/06705; G01R 1/06711; G01R 1/06716; G01R 1/06727; G01R 1/06738; G01R 1/06744; G01R 1/06755; G01R 1/06761; G01R 1/06766; G01R 1/06772; G01R 1/06777; G01R 1/073; G01R 1/07307; G01R 1/07314; G01R 1/07321; G01R 1/07328; G01R 1/07335; G01R 1/07342; G01R 1/0735; G01R 1/07357; G01R 1/07364; G01R 1/07371; G01R 1/07378; G01R 1/07385; G01R 1/07392
See application file for complete search history.

(56) References Cited

U.S. PATENT DOCUMENTS

| 2007/0167022 A1* | 7/2007 | Tsai | ........................ | G01R 3/00 |
| | | | | 438/712 |
| 2019/0353684 A1* | 11/2019 | Kaida | ..................... | G01R 3/00 |

FOREIGN PATENT DOCUMENTS

| TW | 201908737 A | 3/2019 |
| TW | M594142 U | 4/2020 |

* cited by examiner

*Primary Examiner* — Lee E Rodak

(74) *Attorney, Agent, or Firm* — Birch, Stewart, Kolasch & Birch, LLP

(57) ABSTRACT

A probe head includes upper and lower die units, and a linear probe inserted therethrough and thereby defined with tail, body and head portions. A first bottom surface of the upper die unit and a second top surface of the lower die unit face each other, thereby defining an inner space wherein the body portion is located and includes a plurality of sections each having front width larger than or equal to back width, including a narrowest section whose upper and lower ends have a distance from the first bottom surface and the second top surface respectively. The head and tail portions are offset from each other along two horizontal axes and the body portion is thereby curved. The present invention is favorable in dynamic behavior control of the linear probe which is easy in manufacturing, lower in cost and has more variety in material.

20 Claims, 15 Drawing Sheets

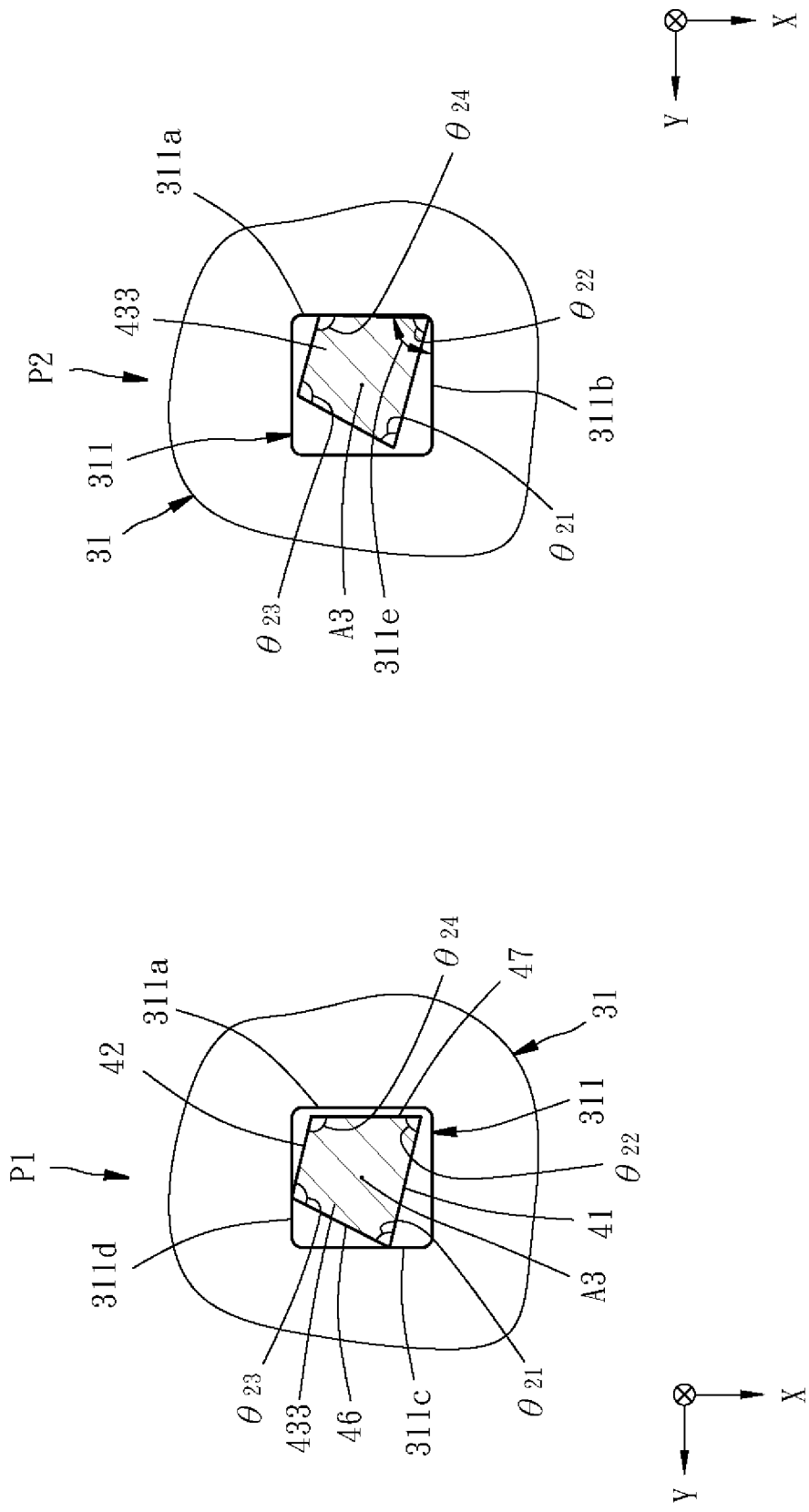

PROBE HEAD WITH LINEAR PROBE

BACKGROUND OF THE INVENTION

1. Field of the Invention

The present invention relates generally to probe heads and probes of probe cards and more particularly, to a probe head with a linear probe.

2. Description of the Related Art

The conventional linear probes, also called wire needles, can be classified into cylindrical needles and square punched needles. The cylindrical needle is formed by directly cutting a metal wire having circular cross sections into an appropriate length and thus cylinder-shaped. On the other hand, the aforementioned square punched needle is formed by partially flattening the cylindrical needle by punching and thus partially has cross sections with the shape similar to a rectangle.

Referring to FIG. 1, a conventional probe head 10 equipped with linear probes primarily includes at least two upper dies 12, at least two lower dies 14 and a plurality of linear probes 16. For simplifying the drawing, only one linear probe 16 is shown in FIG. 1. The head portion 162 of each of the linear probes 16 is adapted to contact a conductive contact pad of a device under test (not shown), and the head portion 162 is inserted through the lower dies 14. The tail portion 164 of each of the linear probes 16 is adapted to be abutted against a conductive contact pad of a circuit board or space transformer (not shown), and the tail portion 164 is inserted through the upper dies 12. In the assembly process of the probe head 10, after the linear probes 16 are inserted through the dies 12 and 14, the upper dies 12 and the lower dies 14 are horizontally displaced from each other to make the head portion 162 and tail portion 164 of each linear probe 16 offset from each other and thereby not located on the same imaginary straight line, so that the body portion 166 of each linear probe 16 is curved. In this way, when the linear probe 16 contacts the conductive contact pad of the device under test, the body portion 166 of the linear probe 16 can provide an elastically adjusting effect to cause the head portion 162 to be in contact with and electrically connected with the conductive contact pad of the device under test positively, and a buffering effect to avoid damage or excessive wear to the conductive contact pad of the device under test or the probe due to an excessive contact force.

The linear probe 16 of the probe head 10 as shown in FIG. 1 is the aforementioned cylindrical needle, which is entirely cylinder-shaped and difficult to be controlled in dynamic behavior thereof when applied with a force. Specifically speaking, in the above-described assembly process of the probe head 10, the body portions 166 of the linear probes 16 may be inconsistent in the direction of the bending deformation thereof due to the horizontal relative displacement of the upper and lower dies 12 and 14. Besides, when the head portions 162 of the linear probes 16 are abutted against the conductive contact pads of the device under test, the body portions 166 of the linear probes 16 may be inconsistent in the moving behavior due to the elastic deformation thereof, and the entirety of each linear probe 16 is also liable to rotate a little bit so that the body portions 166 of the linear probes 16 are more inconsistent in bending direction.

However, the linear probe is widely used in the field of fine pitch, which means the pitch of the linear probes 16 of the probe head 10 is usually quite small. Therefore, the above-mentioned inconsistent deformation direction, inconsistent moving behavior and self-rotation of the linear probes 16 are all liable to cause the body portions 166 of the adjacent linear probes 16 to interfere with each other. In other words, the body portions 166 of the adjacent linear probes 16 may collide with each other, thereby not only deteriorating the aforementioned elastically adjusting effect and buffering effect but also causing wear to the body portions 166. If the abrasion of the insulating layers on the surfaces of the body portions 166 causes electrical connection between the linear probes 16 colliding with each other, a short circuit may occur to damage the probe card or the device under test.

On the other hand, the aforementioned square punched needle has the structural feature that partial cross sections thereof have the shape similar to a rectangle, so the dynamic behavior of the square punched needle applied with a force is controllable by designing its shape, so as to avoid the aforementioned problems of body portion interference, wear and short circuit. However, the aforementioned square punched needle should be installed according to a specific orientation to bring the aforementioned advantages, but the conventional square punched needle is difficult for the installer or user to recognize the orientation of the probe. Besides, the punching process has the problems of mold wear and insufficient processing accuracy, so the manufacturing process of the square punched needle is liable to produce the square punched needles with the size disagreeing with demands, thereby raising the manufacturing cost.

In other words, the conventional cylindrical needle is simple in manufacturing process and relatively lower in cost, but unfavorable to the dynamic behavior control. However, the conventional square punched needle is favorable to the dynamic behavior control, but uneasy in manufacturing and relatively higher in cost. Besides, the aforementioned two kinds of conventional linear probe are both limited in material thereof by the available wires, thereby lacking variety in material.

SUMMARY OF THE INVENTION

The present invention has been accomplished in view of the above-noted circumstances. It is an objective of the present invention to provide a probe head which is favorable to dynamic behavior control of a linear probe thereof, and the linear probe is relatively easier in manufacturing, lower in cost and has more variety in material.

To attain the above objective, the present invention provides a probe head which includes an upper die unit, a lower die unit and a linear probe. The upper die unit has a first top surface, a first bottom surface and an upper installation hole penetrating through the first top surface and the first bottom surface. The lower die unit has a second top surface, a second bottom surface and a lower installation hole penetrating through the second top surface and the second bottom surface. The second top surface and the first bottom surface face each other and thereby an inner space is defined between the second top surface and the first bottom surface. The linear probe is inserted through the upper installation hole and the lower installation hole and thereby defined with a tail portion located in the upper installation hole and protruding out of the first top surface, a head portion located in the lower installation hole and protruding out of the second bottom surface, and a body portion connecting the tail portion with the head portion. The tail portion includes a stopping section abutted on the first top surface. The linear probe has a front surface and a back surface facing opposite directions. The linear probe is defined respectively on the front surface and back surface thereof with front width and back width parallel to a width axis, and defined with thickness perpendicularly to the width axis. The body portion includes a plurality of sections, including a narrowest section. Each of the sections has the front width larger than the back width. The front width of the narrowest section is smaller than the front width of any other section of the body portion. The head portion includes a lower inserted section located in the lower installation hole. The lower inserted section has the front width larger than the back width. The upper installation hole is defined with a first central axis. The lower installation hole is defined with a second central axis. The first central axis is offset from the second central axis toward a first direction for a first offset value and offset from the second central axis toward a second direction perpendicular to the first direction for a second offset value smaller than the first offset value, and thereby the body portion of the linear probe is curved. Specifically speaking, the linear probe has a first lateral surface and a second lateral surface, which connect the front surface with the back surface, and is defined with a first front included angle between the first lateral surface and the front surface, a second front included angle between the second lateral surface and the front surface, a first back included angle between the first lateral surface and the back surface, and a second back included angle between the second lateral surface and the back surface. The inner wall of each of the upper installation hole and the lower installation hole has a first side facing toward the first direction, a second side facing toward the second direction, a third side facing toward the reverse of the first direction, and a fourth side facing toward the reverse of the second direction. The first front included angle and first back included angle of the tail portion are abutted on the third side and fourth side of the inner wall of the upper installation hole, respectively. The second front included angle of the head portion is orientated toward the included angle between the first side and second side of the lower installation hole.

As a result, different sections of the body portion of the linear probe are different in area moment of inertia because of their difference in width. Resulted from such difference in area moment of inertia, the body portion will have elastic bending deformation in a specific direction when the linear probe is applied with a force due to assembly or probing the device under test. Therefore, by the design of the widths of the sections of the body portion, it is favorable to the dynamic behavior control of the linear probe applied with a force, so as to make the linear probes of the same probe head consistent in dynamic behavior and thereby prevented from interference and short circuit. Preferably, if the body portion and the inner space formed by the upper and lower die units are arranged in a way that the narrowest section of the body portion has a distance from both the upper and lower die units and is thereby completely located in the inner space, it brings the aforementioned effects even better. Besides, the linear probe can be shaped with the required width difference by a cutting process such as laser cutting. Such manufacturing process is relatively easier and costs relatively lower. In other words, the linear probe of the present invention can have the advantages of both the conventional cylindrical needle and square punched needle. Besides, the linear probe of the present invention may be cut from a plate, thereby having more variety in material. In addition, the linear probe is abutted on the upper and lower die units relatively more stably. In particularly, the head portion can be abutted on the inner wall of the lower installation hole quite stably, so that the linear probe has high stability when probing the device under test.

On the other hand, the linear probe of the probe head of the present invention may be a linear probe having an asymmetric tail portion. Specifically speaking, the tail portion, body portion and head portion of the linear probe extend along a central axis of the linear probe in order. The linear probe is defined with an imaginary reference surface including the central axis. The tail portion includes an exposed part protruding out of the first top surface. The exposed part is asymmetric with respect to the imaginary reference surface. Resulted from the technical feature that the tail portion of the linear probe is asymmetric, when the installer installs the linear probe into a probe seat including the aforementioned upper and lower die units, or when the user replaces the linear probe, the orientation of the probe can be recognized according to the exposed part of the tail portion. In this way, as long as the linear probes disposed in the same probe seat are arranged in a way that the exposed parts thereof are all consistent in orientation, it is ensured that the parts of the linear probes located in the probe seat are all consistent in orientation as well. Therefore, the linear probe of the present invention is convenient for the installer or user to arrange the linear probes disposed in the same probe seat in a way that the front surfaces or back surfaces thereof are all consistent in direction, so that all the linear probes are consistent in dynamic behavior and thereby prevented from interference and short circuit.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein:

FIGS. 11a-11d are schematic sectional views showing the tail portion and head portion of the linear probe and the upper and lower installation holes of the probe seat in the direction from the bottom to the top of the probe head;

DETAILED DESCRIPTION OF THE INVENTION

Figure 1:
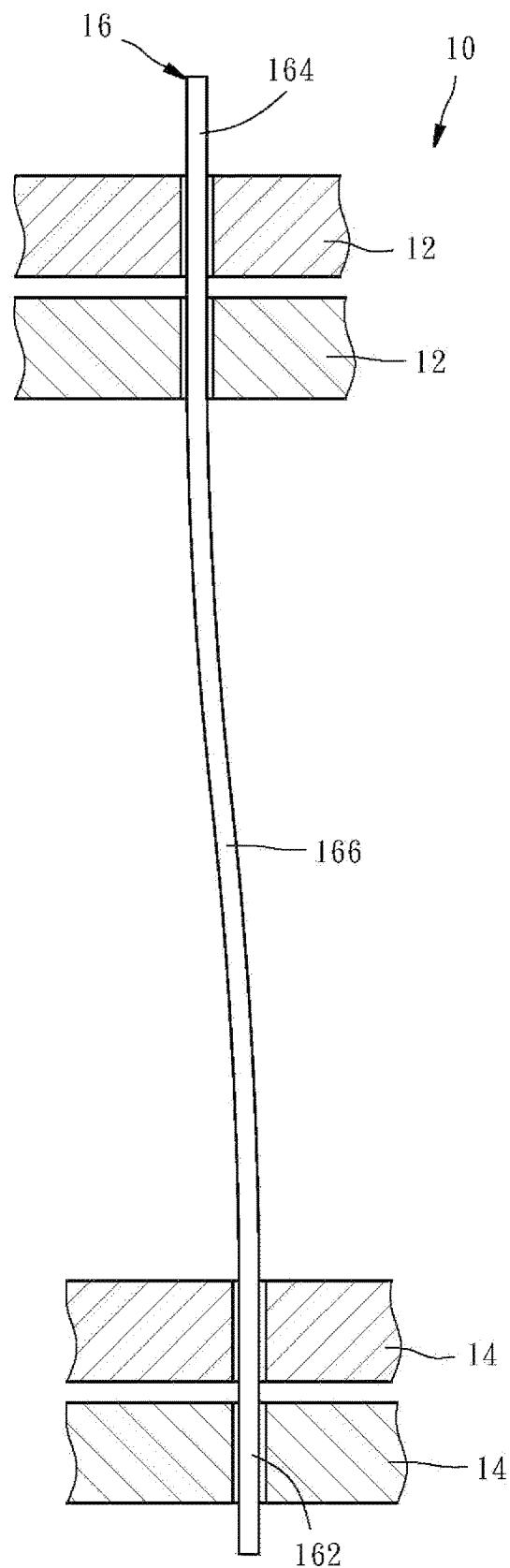
FIG. 1 is a schematic sectional view of a conventional probe head with a linear probe.

First of all, it is to be mentioned that same or similar reference numerals used in the following embodiments and the appendix drawings designate same or similar elements or the structural features thereof throughout the specification for the purpose of concise illustration of the present invention. It should be noticed that for the convenience of illustration, the components and the structure shown in the figures are not drawn according to the real scale and amount, and the features mentioned in each embodiment can be applied in the other embodiments if the application is possible in practice.

Figure 2A:
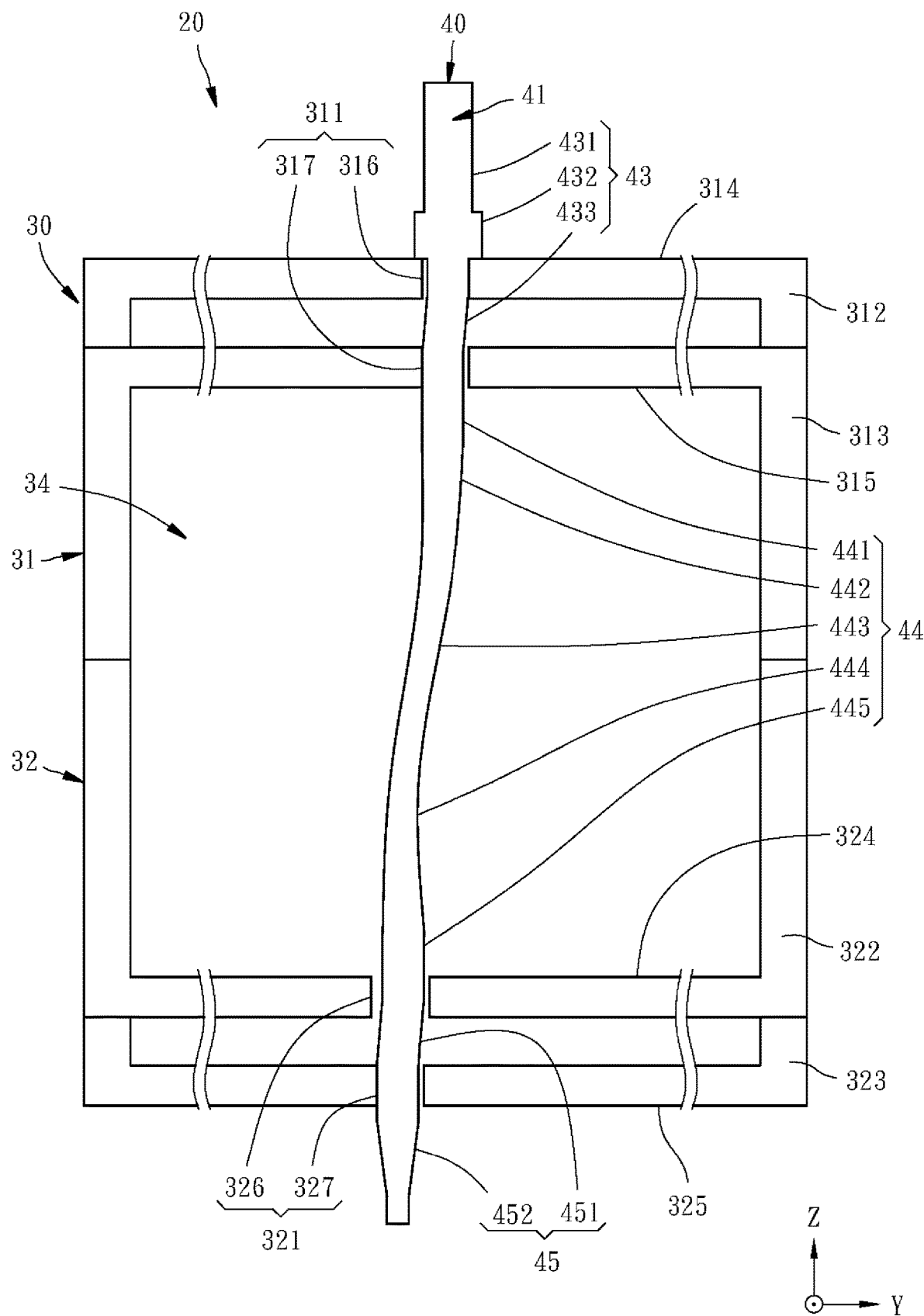
FIG. 2A is a schematic sectional view of a probe head with a linear probe according to a preferred embodiment of the present invention.

Referring to FIG. 2A, a probe head 20 according to a preferred embodiment of the present invention primarily includes a probe seat 30 and a linear probe 40. The amount of the linear probe 40 is unlimited. The probe seat 30 includes an upper die unit 31 and a lower die unit 32. The upper and lower die units 31 and 32 respectively have upper and lower installation holes 311 and 321 for the installation of the linear probe 40. The amount of the upper and lower installation holes 311 and 321 is unlimited. The probe head 20 usually includes hundreds or even thousands of linear probes 40, thereby also provided with hundreds or thousands of upper and lower installation holes 311 and 321. However, for the simplification of the figures and the convenience of illustration, only one upper installation hole 311, one lower installation hole 321 and one linear probe 40 are shown in the figures of the present invention.

In this embodiment, the upper die unit 31 includes a first upper die 312 and a second upper die 313, which are piled on one another. The upper die unit 31 has a first top surface 314 located on the first upper die 312, and a first bottom surface 315 located on the second upper die 313. The upper installation hole 311 penetrates through the first top surface 314 and the first bottom surface 315. In other words, the upper installation hole 311 includes a first upper through hole 316 penetrating through the first upper die 312 and a second upper through hole 317 penetrating through the second upper die 313. The first and second upper through holes 316 and 317 are coaxial with each other. Likewise, the lower die unit 32 includes a first lower die 322 and a second lower die 323, which are piled on one another. The lower die unit 32 has a second top surface 324 located on the first lower die 322, and a second bottom surface 325 located on the second lower die 323. The lower installation hole 321 penetrates through the second top surface 324 and the second bottom surface 325. In other words, the lower installation hole 321 includes a first lower through hole 326 penetrating through the first lower die 322 and a second lower through hole 327 penetrating through the second lower die 323. The first and second lower through holes 326 and 327 are coaxial with each other. However, the amounts of the dies of the upper and lower die units 31 and 32 are unlimited. The upper die unit 31 may include at least one upper die. The lower die unit 32 may include at least one lower die.

Figure 3:
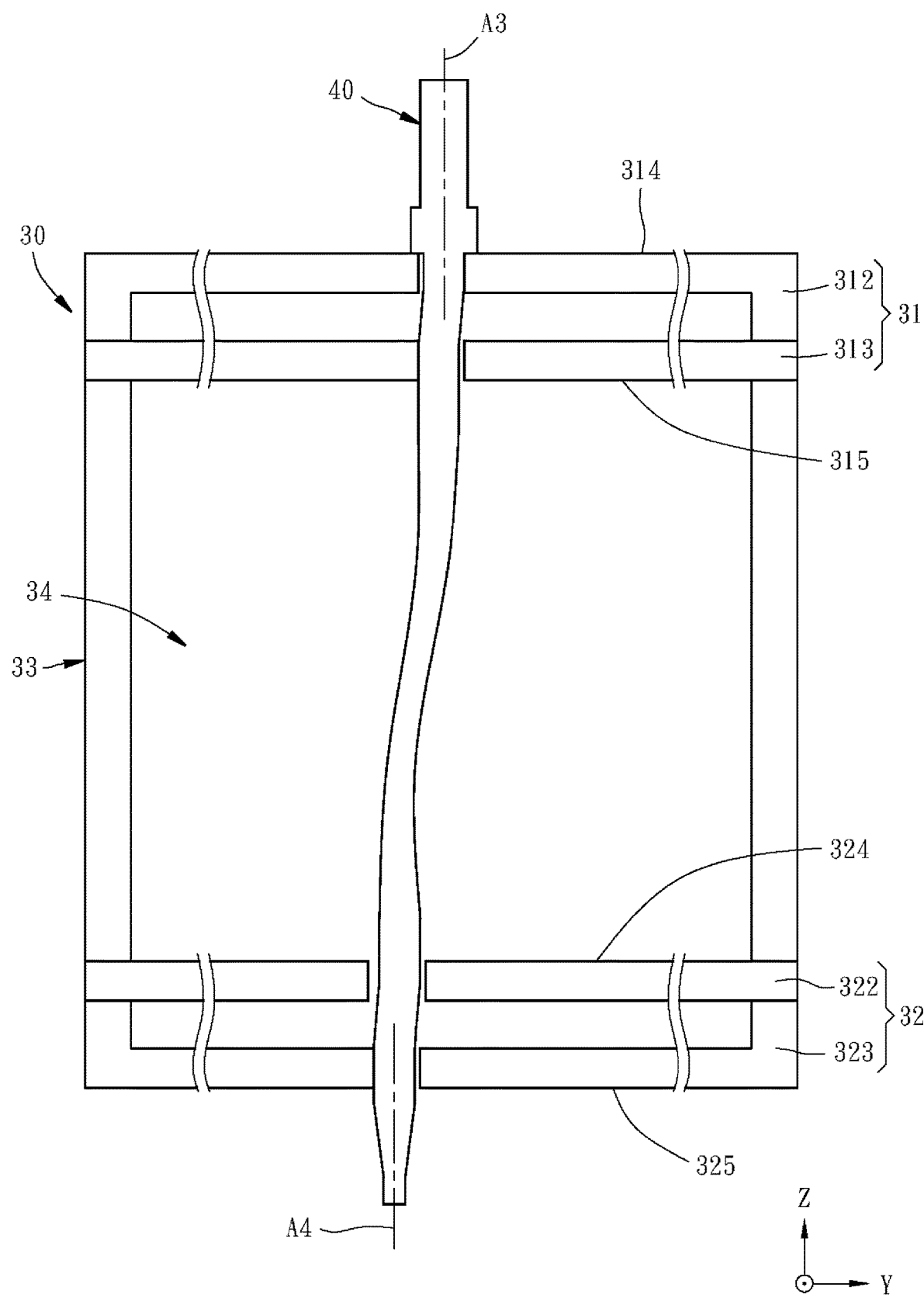
FIG. 3 is similar to FIG. 2A, but showing another type of a probe seat of the probe head.

In the probe seat 30 as shown in FIG. 2A, the bottom of the second upper die 313 is directly connected with the top of the first lower die 322. In other words, the upper and lower die units 31 and 32 are connected with each other directly. However, as shown in FIG. 3, the probe seat 30 in the present invention may include a middle die unit 33 including at least one middle die and disposed between the upper and lower die units 31 and 32. The upper and lower die units 31 and 32 are indirectly connected with each other through the middle die unit 33. No matter if the probe seat 30 includes the middle die unit 33 or not, the second top surface 324 of the lower die unit 32 and the first bottom surface 315 of the upper die unit 31 face each other, and the probe seat 30 has an inner space 34 defined between the second top surface 324 and the first bottom surface 315.

Figure 4:
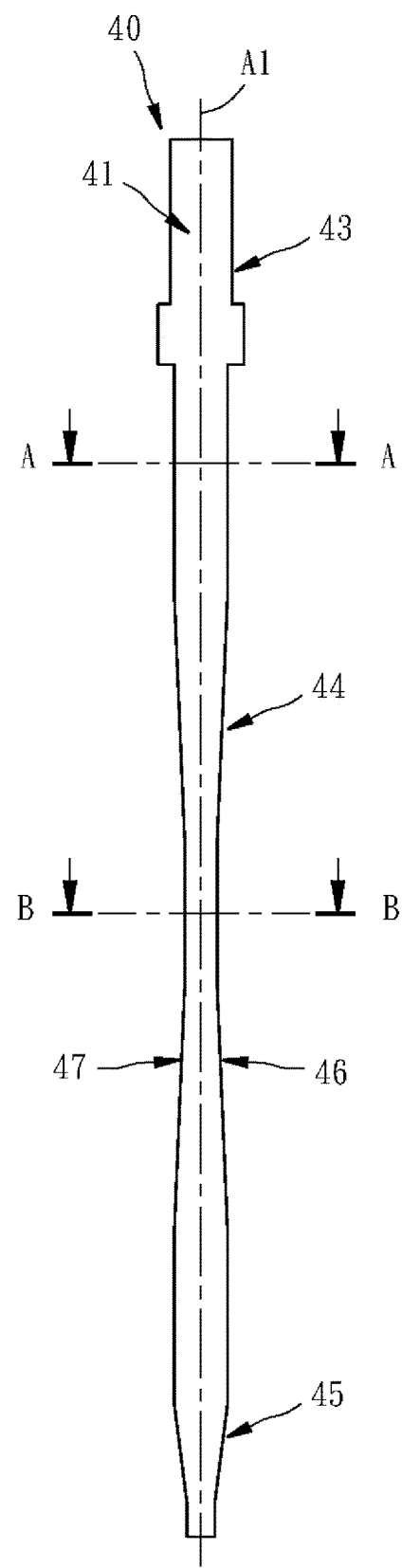
FIG. 4 is a schematic front view of the linear probe.
Figure 5:
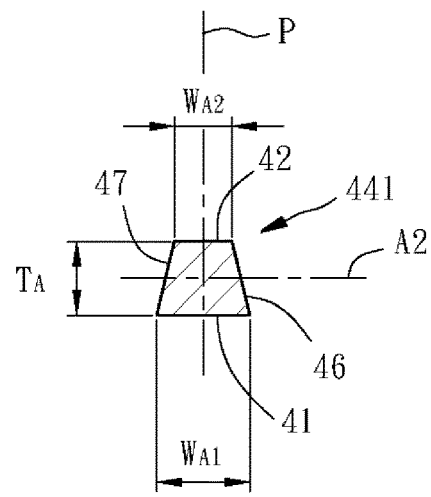
FIG. 5 and FIG. 6 are schematic sectional views taken along the line A-A and the line B-B in FIG. 4, respectively.
Figure 6:
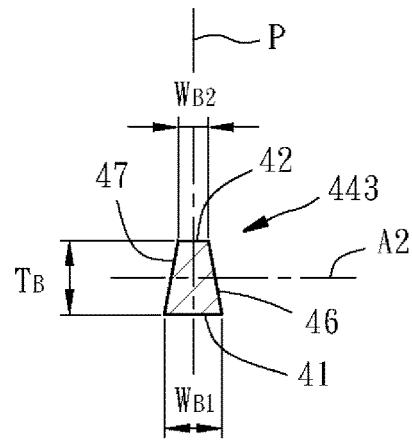

As shown in FIG. 4, after the manufacturing and before the installation and the use, the linear probe 40 is straight and defined along the longitudinal direction thereof with a central axis A1. The linear probe 40 is formed from a plate (not shown) by laser cutting. Therefore, as shown in FIG. 5 and FIG. 6, the linear probe 40 is defined with a width axis A2 perpendicular to the central axis A1, and has a front surface 41 and a back surface 42, which face opposite directions. The linear probe 40 is defined parallel to the width axis A2 on the front surface 41 and the back surface 42 respectively with front width, such as $W_{A1}$ and $W_{B1}$ that will be specified in the following, and back width, such as $W_{A2}$ and $W_{B2}$ that will be specified in the following. The laser cutting process can cut the plate into the linear probe 40 fast and accurately, and provide it the shape with the specific width variation as shown in FIG. 4, which means each section thereof has specifically designed front width and back width, which will be specified in the following. Specifically speaking, the linear probe 40 has a first lateral surface 46 and a second lateral surface 47, which connect the front surface 41 with the back surface 42. The first lateral surface 46 and the second lateral surface 47 are formed by laser cutting, and the cutting direction is not totally along the central axis A1, but forms the shape as shown in FIG. 4, so that the distance between the first lateral surface 46 and the second lateral surface 47 along the width axis A2 is not constant but specifically varied.

Figure 7:
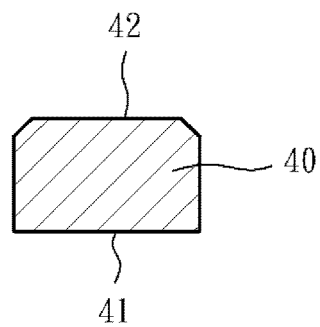
FIG. 7 is a schematic sectional view similar to FIG. 5, showing another type of the cross section of the linear probe.

Referring to FIG. 5 to FIG. 7, the linear probe 40 is preferably designed with non-square or non-rectangular cross sections to have the front width larger than back width. For example, the cross sections of the linear probe 40 may be shaped as a trapezoid as shown in FIG. 5 and FIG. 6, a hexagon as shown in FIG. 7 or other shapes having the front width a little larger than back width. Specifically speaking, the linear probe 40 is preferably configured in a way that at least a part of the linear probe 40, especially the body portion 44, or even every section of the entire linear probe 40 has the front width larger than back width. Besides, the linear probe 40 is defined perpendicularly to the width axis A2 with thickness, such as $T_A$ and $T_B$ that will be specified in the following. The linear probe 40 is equal in thickness to the aforementioned plate. The plate may be uniform in thickness, so that the entire linear probe 40 is uniform in thickness. Alternatively, the plate may be non-uniform in thickness to make the linear probe 40 have specific thickness variation, which will be specified in the following. In addition, the linear probe 40 is defined with a first front included angle between the first lateral surface 46 and the front surface 41, such as $\theta_{11}$ and $\theta_{21}$ as shown in FIGS. 11a-11d, which will be specified in the following, a second front included angle between the second lateral surface 47 and the front surface 41, such as $\theta_{12}$ and $\theta_{22}$ as shown in FIGS. 11a-11d, which will be specified in the following, a first back included angle between the first lateral surface 46 and the back surface 42, such as $\theta_{13}$ and $\theta_{23}$ as shown in FIGS. 11a-11d, which will be specified in the following, and a second back included angle between the second lateral surface 47 and the back surface 42, such as $\theta_{14}$ and $\theta_{24}$ as shown in FIGS. 11a-11d, which will be specified in the following.

Figure 2B:
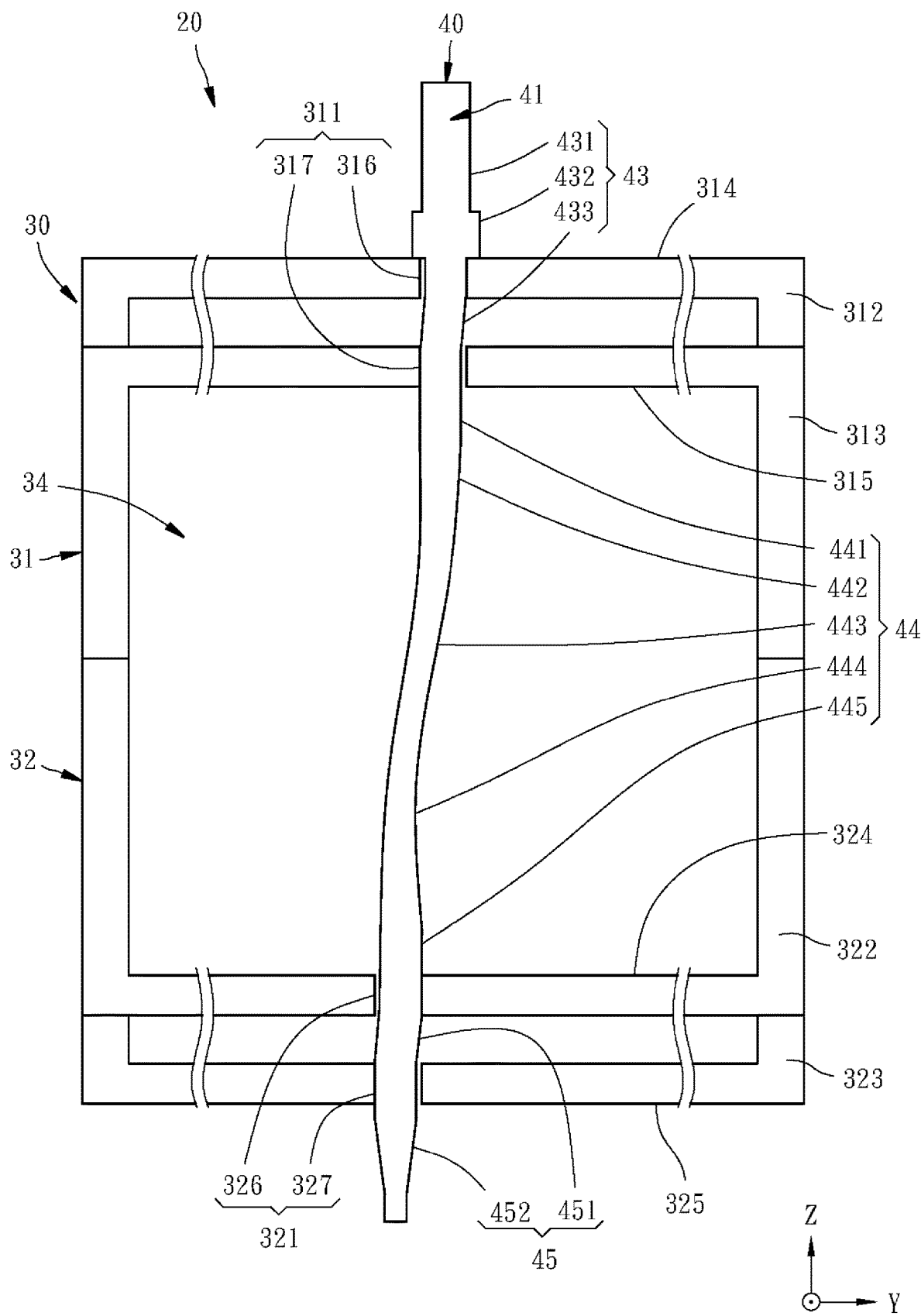
FIG. 2B is similar to FIG. 2A, but different in the width of a first lower through hole.
Figure 8:
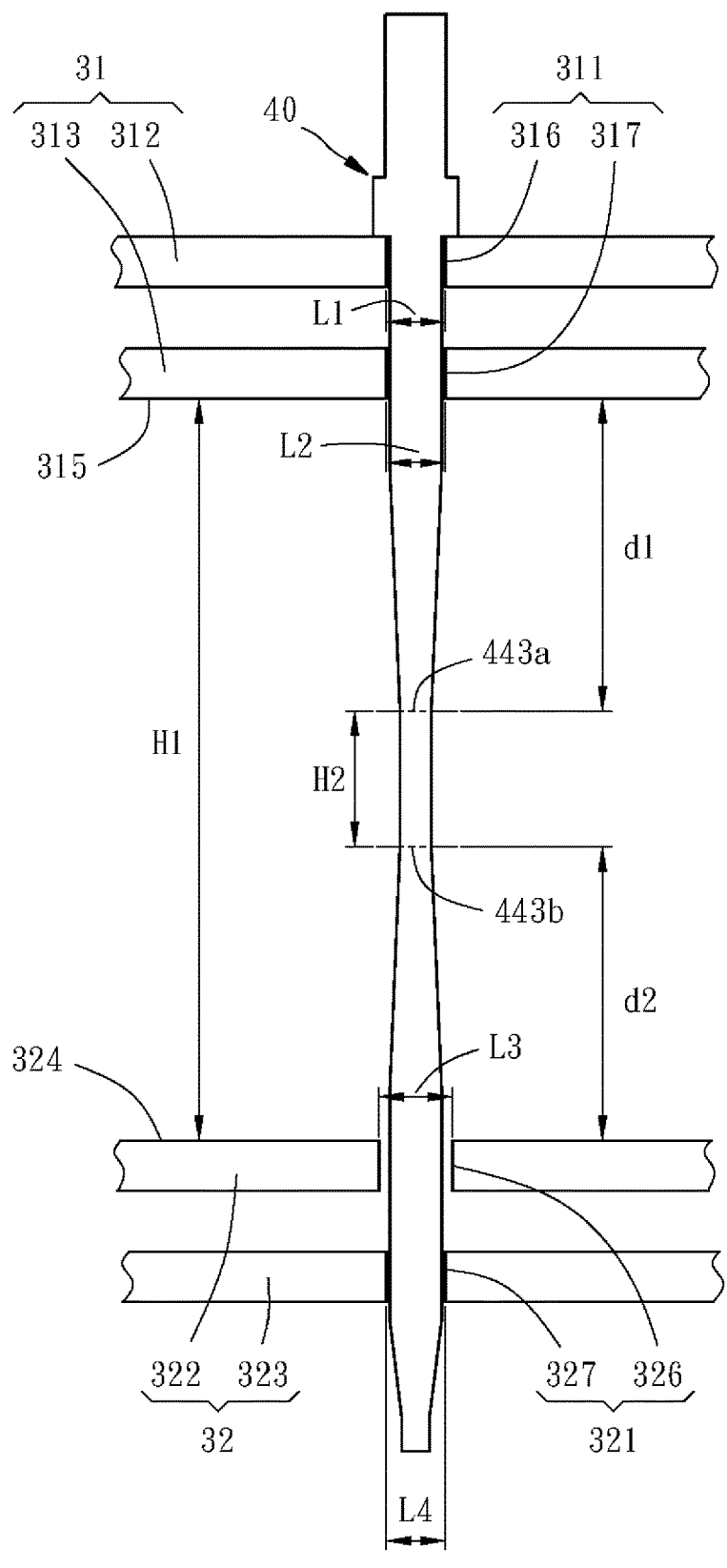
FIG. 8 is a schematic sectional view showing a status of the probe head in the assembly process thereof.
Figure 8:
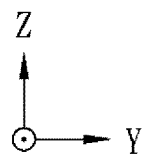
Figure 10:
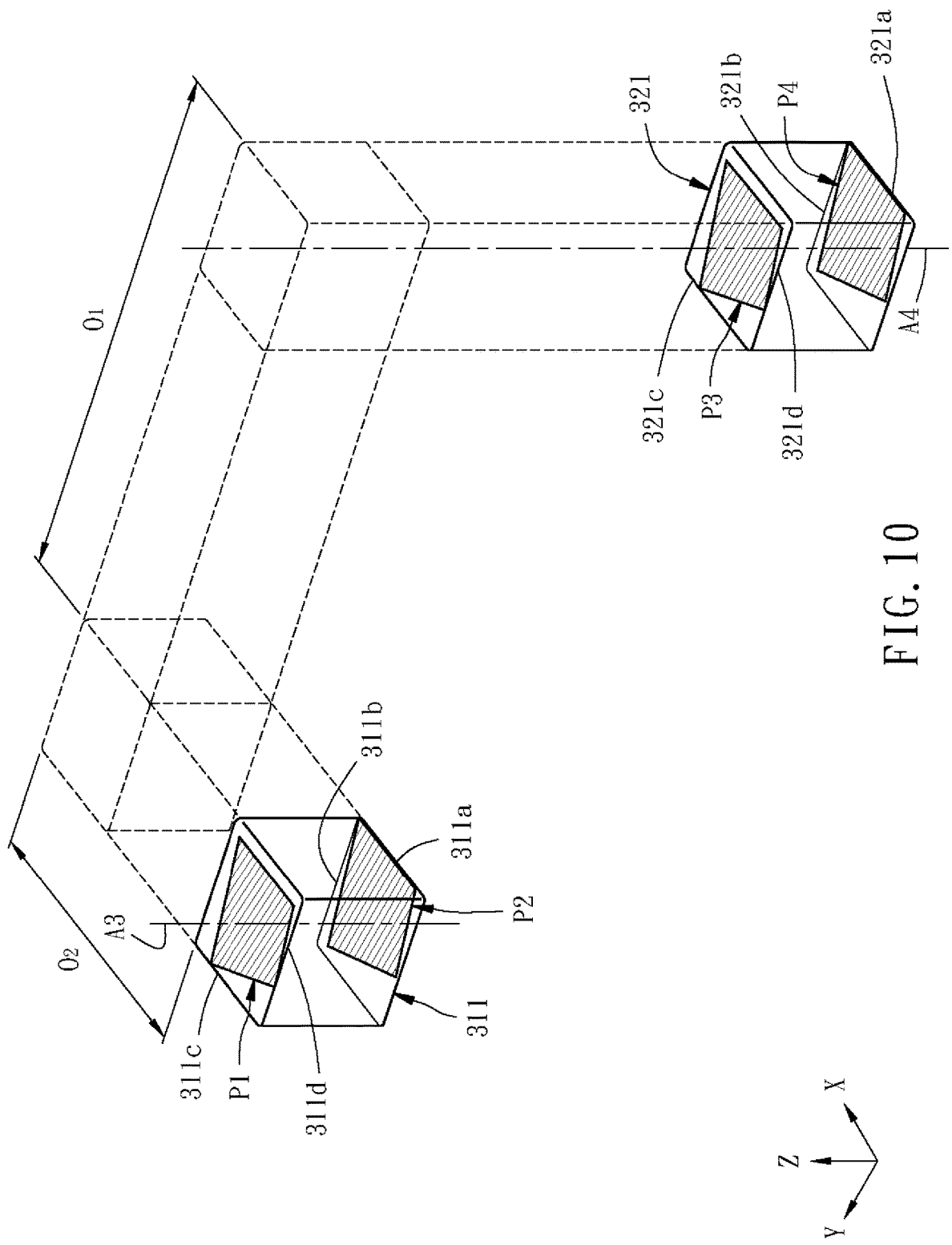
FIG. 10 is a schematic perspective view showing that upper and lower installation holes of the probe seat are offset from each other along two horizontal axes.

In the assembly process of the probe head 20, the upper and lower die units 31 and 32 are firstly arranged as shown in FIG. 8 to make the upper and lower installation holes 311 and 321 for a same linear probe 40 to be inserted therethrough coaxial with each other. After all linear probes 40 are inserted through the upper and lower installation holes 311 and 321, the upper and lower die units 31 and 32 are displaced from each other along two horizontal axes (X-axis and Y-axis) to make the formerly coaxial upper and lower installation holes 311 and 321 offset from each other as shown in FIG. 10. Then, the upper and lower die units 31 and 32 are directly or indirectly fixed to each other, so that the probe head 20 as shown in FIG. 2A or FIG. 3 is completed. Specifically speaking, as shown in FIG. 3 and FIG. 10, the upper installation hole 311 is defined through the center thereof with a first central axis A3, and the lower installation hole 321 is defined through the center thereof with a second central axis A4. In FIG. 10, the first central axis A3 is offset from the second central axis A4 toward a first direction (positive direction of Y-axis) for a first offset value $O_1$, and offset from the second central axis A4 toward a second direction perpendicular to the first direction (negative direction of X-axis) for a second offset value $O_2$ smaller than the first offset value $O_1$. FIG. 3 only shows that the upper and lower die units 31 and 32 are offset from each other along the Y-axis. The first central axis A3 may be offset from the second central axis A4 toward the negative direction of Y-axis. It is to be mentioned that in FIG. 10 and FIGS. 11a-11d, the upper and lower installation holes 311 and 321 are both square holes with equal side lengths, similar to the type as shown in FIG. 2B that the width of the first and second upper through holes 316 and 317 and first and second lower through holes 326 and 327 along the Y-axis are all equal. However, in FIG. 2A, FIG. 3 and FIG. 8, the width of the first lower through hole 326 along the Y-axis is larger than those of other holes, which will be specified in the following.

Referring to FIG. 2A, FIG. 2B and FIG. 4, the linear probe 40 has a tail portion 43, a body portion 44 and a head portion 45 extending along the central axis A1 in order. The tail portion 43 is defined as the part of the linear probe 40 located in the upper installation hole 311 and protruding out of the first top surface 314. The head portion 45 is defined as the part of the linear probe 40 located in the lower installation hole 321 and protruding out of the second bottom surface 325. The body portion 44 is defined as the part of the linear probe 40 located in the inner space 34. Resulted from the above-described step in the assembly process that the upper and lower die units 31 and 32 are displaced from each other along the X-axis and the Y-axis, the body portion 44 of the linear probe 40 is curved as shown in FIG. 2A, FIG. 2B and FIG. 3 and thereby has the elastically adjusting effect and buffering effect.

Figure 9:
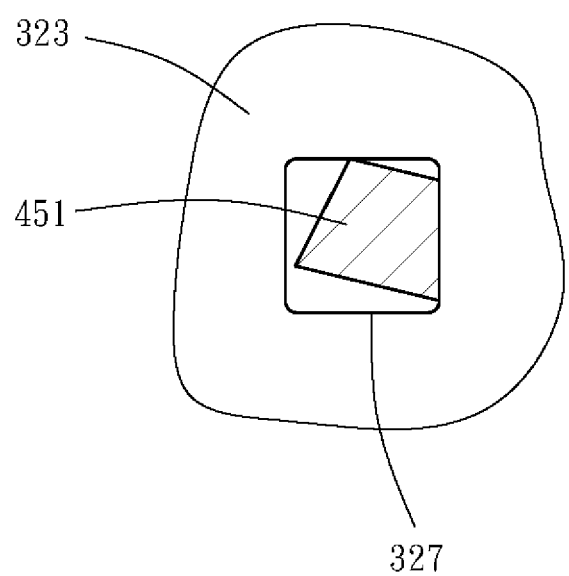
FIG. 9 is a schematic sectional view showing that a head portion of the linear probe is abutted on two adjacent sides of a lower installation hole.

In the case that the linear probe 40 has square or rectangular cross sections and thereby has the front width equal to back width, after the upper and lower die units 31 and 32 are displaced from each other along the width axis A2, the tail portion 43 and head portion 45 of the linear probe 40 will be abutted on a single side of the inner wall of the upper and lower installation holes 311 and 321. For example, the tail portion 43 is abutted on the right side of the inner wall of the upper installation hole 311, and the head portion 45 is abutted on the left side of the inner wall of the lower installation hole 321. However, in the case that the cross sections of the linear probe 40 have the shape with the front width larger than back width, such as trapezoid or hexagon, after the upper and lower die units 31 and 32 are displaced from each other along the width axis A2, the tail portion 43 and head portion 45 of the linear probe 40 will be abutted on two adjacent sides of the inner wall of the upper and lower installation holes 311 and 321. For example, the tail portion 43 is abutted on the right side and the rear side of the inner wall of the upper installation hole 311, and the head portion 45 is abutted on the left side and the rear side of the inner wall of the lower installation hole 321. Specifically speaking, the lower inserted section 451 of the head portion 45 is abutted on two adjacent sides of the second lower through hole 327 of the second lower die 323, as shown in FIG. 9. In the practical inspection of the coordinate position of the probe head of the probe card by the tester, the linear probe 40 with the head portion 45 abutted on a single side of the inner wall is liable to sway when scraping away the insulated layer on the surface of the device under test, but the linear probe 40 with the head portion 45 abutted on two adjacent sides of the inner wall is relatively more stable, prevented from swaying when scraping away the insulated layer on the surface of the device under test, and has relatively better performance in alignment test. Therefore, the linear probe 40 of the present invention is preferably designed with the front width larger than back width. Besides, the following-described features of the present invention makes the head portion 45 of the linear probe 40 abutted on the inner wall of the lower installation hole more positively when probing, so that even if the linear probe 40 partially or entirely has the front width equal to the back width, the above-described unstable problem will be still avoided. The required relation between the front width and the back width of the linear probe 40 can be achieved by controlling the power of the laser cutting process. Therefore, although the linear probe 40 of the type with the front width equal to the back width is not shown in the figures of the present invention, it should be understood by those skilled in the art.

Figure 11D:
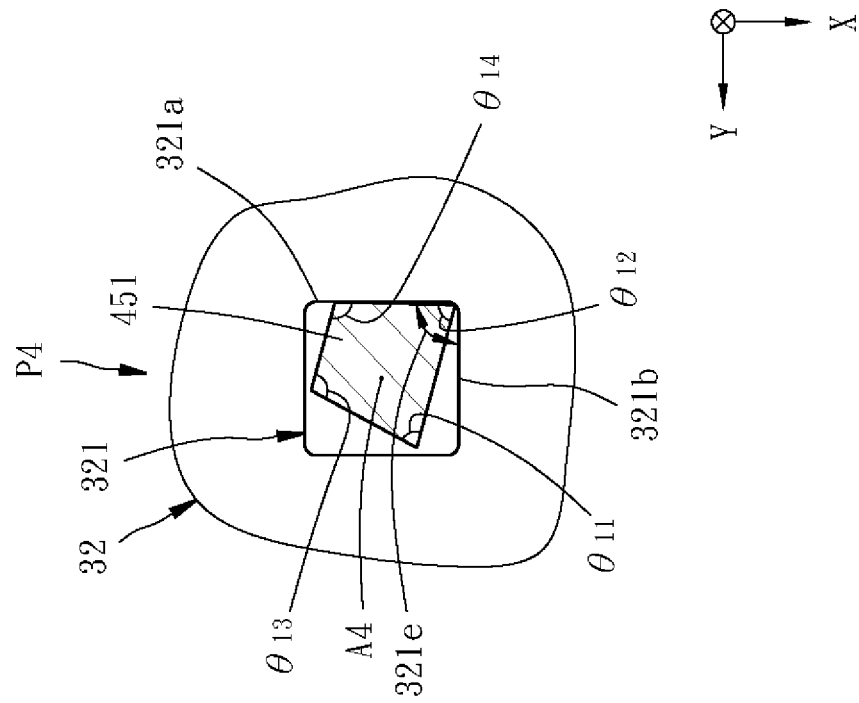
Figure 11C:
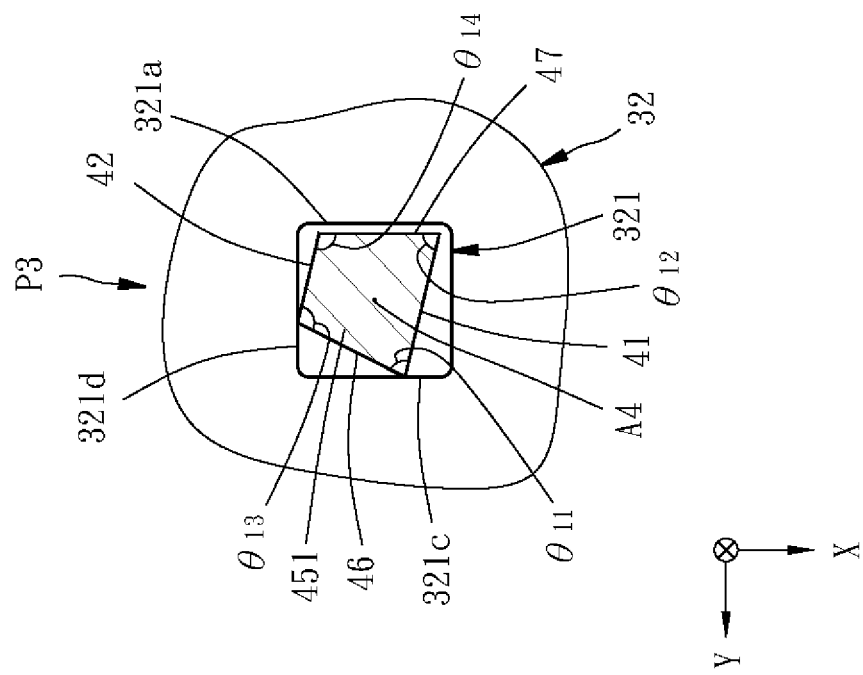

In this embodiment, the cross sections of the linear probe 40 has the shape with the front width larger than back width, such as trapezoid or hexagon, so that every section of the linear probe 40 has the first and second front included angles smaller than first and second back included angles. For example, as shown in FIGS. 11c-11d, the head portion 45 has the first and second front included angles $\theta_{11}$ and $\theta_{12}$ smaller than the first and second back included angles $\theta_{13}$ and $\theta_{14}$, and as shown in FIGS. 11a-11b, the tail portion 43 has the first and second front included angles $\theta_{21}$ and $\theta_{22}$ smaller than the first and second back included angles $\theta 23$ and $\theta_{24}$. Besides, as shown in FIG. 10, the upper installation hole 311 is offset from the lower installation hole 321 in a way that the first offset value $O_1$ along the Y-axis is larger than the second offset value $O_2$ along the X-axis, and the offset along the X-axis is in the direction the back surface 42 of the linear probe 40 faces toward, such that the linear probe 40 is even more stable. Specifically speaking, in the case as this embodiment that the upper and lower die units 31 and 32 are each composed of a plurality of dies, or even in the case that the upper and lower die units 31 and 32 are each composed of only a single die but the thickness thereof is relatively larger, the aforementioned designed feature causes the parts of the tail portion 43 and head portion 45 of the linear probe 40 located in the upper and lower installation holes 311 and 321 to have specific bending deformation so as to be stably abutted on the inner walls of the upper and lower installation holes 311 and 321.

Further speaking, the linear probe 40 is defined with first to fourth positions P1-P4 as shown in FIG. 10 and FIGS. 11a-11d. The first and second positions P1 and P2 are the positions of the upper inserted section 433 of the tail portion 43 located at the upper end and lower end of the upper installation hole 311, respectively. In other words, the second position P2 is closer to the body portion 44 than the first position P1 is. The third and fourth positions P3 and P4 are the positions of the lower inserted section 451 of the head portion 45 located at the upper end and lower end of the lower installation hole 321, respectively. In other words, the fourth position P4 is farther away from the body portion 44 than the third position P3. The inner walls of the upper installation hole 311 and the lower installation hole 321 both have a first side 311a and 321a facing toward the first direction (the positive direction of Y-axis), a second side 311b and 321b facing toward the second direction (the negative direction of X-axis), a third side 311c and 321c facing toward the reverse of the first direction (the negative direction of Y-axis), and a fourth side 311d and 321d facing toward the reverse of the second direction (the positive direction of X-axis). As shown in FIG. 11c, at the third position P3 of the lower inserted section 451 of the head portion 45, the first front included angle $\theta_{11}$ and first back included angle $\theta_{13}$ thereof are abutted on the adjacent third and fourth sides 321c and 321d of the inner wall of the lower installation hole 321, respectively. As shown in FIG. 11d, at the fourth position P4 of the lower inserted section 451 of the head portion 45, the second front included angle $\theta_{12}$ thereof is orientated toward or even abutted against the included angle 321e between the adjacent first and second sides 321a and 321b of the inner wall of the lower installation hole 321. As shown in FIG. 11b, at the second position P2 of the upper inserted section 433 of the tail portion 43, the second front included angle $\theta_{22}$ thereof is orientated toward or even abutted against the included angle 311e between the adjacent first and second sides 311a and 311b of the inner wall of the upper installation hole 311, and the part of the second lateral surface 47 of the linear probe 40 located in the upper installation hole 311 faces toward or is even abutted against the first side 311a of the inner wall of the upper installation hole 311. As shown in FIG. 11a, at the first position P1 of the upper inserted section 433 of the tail portion 43, the first front included angle $\theta_{21}$ and first back included angle $\theta_{23}$ thereof are abutted on the adjacent third and fourth sides 311c and 311d of the inner wall of the upper installation hole 311, respectively. In this way, the linear probe 40 is stably abutted on the inner walls of the upper and lower installation holes 311 and 321. In particularly, the head portion 45 is not only abutted on two adjacent sides 321c and 321d of the lower installation hole 321 by two adjacent included angles $\theta_{11}$ and $\theta_{13}$ at the third position P3 when the assembly of the probe head is accomplished so as to have high stability, but the head portion 45 will be abutted on the first side 321a of the lower installation hole 321 by the second lateral surface 47 when the head portion 45 is a little inclined by the force applied to the bottom end thereof so as to have even higher stability when probing. In other words, compared with the case that the probe seat 30 is offset along only a single horizontal axis, the case that the probe seat 30 is offset along two horizontal axes can bring better effect of limiting the position of the linear probe 40 and thereby make its alignment performance even better.

As shown in FIG. 2A, the tail portion 43 includes an abutted section 431 and a stopping section 432, which protrude above the first top surface 314 and thus exposed, and an upper inserted section 433 located in the upper installation hole 311. The stopping section 432 is abutted on the first top surface 314 to prevent the linear probe 40 from falling out of the probe seat 30. The abutted section 431 is adapted to be abutted against a circuit board or space transformer (not shown), so that the probe head 20 and the space transformer and/or circuit board compose a probe card. The head portion 45 includes a lower inserted section 451 located in the lower installation hole 321, and a probing section 452 protruding below the second bottom surface 325 and thus exposed. The probing section 452 is adapted to contact a device under test. The width of the probing section 452 gradually decreases from the top to bottom thereof, bringing a guiding effect when being inserted through each of the through holes 316, 317, 326 and 327.

The body portion 44 includes a first widest section 441, a gradually narrowing section 442, a narrowest section 443, a gradually widening section 444 and a second widest section 445, which extend in order from the upper inserted section 433 of the tail portion 43 to the lower inserted section 451 of the head portion 45. Each of the widest sections 441 and 445 has the front width $W_{A1}$ and back width $W_{A2}$ (as shown in FIG. 5 and FIG. 6) equal to those of each of the inserted sections 433 and 451. The gradually narrowing section 442 extends with the front width and back width both gradually decreasing from the first widest section 441 to the upper end 443a of the narrowest section 443 (as shown in FIG. 8). The gradually widening section 444 extends with the front width and back width both gradually increasing from the lower end 443b of the narrowest section 443 (as shown in FIG. 8) to the second widest section 445.

In other words, the front width $W_{A1}$ of each of the widest sections 441 and 445 is larger than the front width of any other section of the body portion 44, the back width $W_{A2}$ of each of the widest sections 441 and 445 is larger than the back width of any other section of the body portion 44, the front width $W_{B1}$ of the narrowest section 443 is smaller than the front width of any other section of the body portion 44, and the back width $W_{B2}$ of the narrowest section 443 is smaller than the back width of any other section of the body portion 44. Besides, as described above, each of the sections 441-445 is preferably designed with the front width larger than back width, but the present invention is unlimited thereto. Each of the sections 441-445 may have the front width equal to back width. In addition, in this embodiment, each of the widest sections 441 and 445 has the front width $W_{A1}$ equal to thickness $T_A$, and the thickness $T_A$ of each of the widest sections 441 and 445 is equal to the thickness $T_B$ of the narrowest section 443. However, in other embodiments, the thickness $T_A$ of the widest sections 441 and 445 may be larger than the thickness $T_B$ of the narrowest section 443. Furthermore, in this embodiment, the thickness $T_B$ of the narrowest section 443 is larger than the front width $W_{B1}$ of the narrowest section 443. However, in other embodiments, the thickness $T_B$ of the narrowest section 443 may be equal to the front width $W_{B1}$ of the narrowest section 443. Therefore, the dimensions of the body portion 44 satisfy the following inequalities:

$W_{A1} > W_{B1}$;

$W_{A2} > W_{B2}$;

$T_A = W_{A1} \geq W_{A2}$;

$T_B \geq W_{B1} \geq W_{B2}$;

$T_A \geq T_B$.

By the dimensional design of the body portion 44 and the arrangement of the body portion 44 and the inner space 34 that the upper and lower ends 443a and 443b of the narrowest section 443 of the body portion 44 have distances d1 and d2 from the first bottom surface 315 and the second top surface 324 respectively, as shown in FIG. 8, wherein the distance d1 and distance d2 may be equal or unequal, the present invention is favorable to the dynamic behavior control of the linear probe 40 applied with a force for making the plurality of linear probes 40 of a same probe head 20 consistent in dynamic behavior due to the force applied thereto during assembly or probing, thereby preventing the probes from interference and short circuit. For even better dynamic behavior control of the linear probe 40, the ratio of the front width and back width of each section of the body portion 44, especially the widest sections 441 and 445 and the narrowest section 443, may be larger than or equal to 1 and smaller than 1.5, the ratio of the front width $W_{A1}$ of each of the widest section 441 and 445 and the front width $W_{B1}$ of the narrowest section 443 may be larger than 1 and smaller than or equal to 1.7, and the ratio of the back width $W_{A2}$ of each of the widest sections 441 and 445 and the back width $W_{B2}$ of the narrowest section 443 may be larger than 1 and smaller than or equal to 1.7. In other words, it is more favorable to the dynamic behavior control of the linear probe 40 that the dimensions of the body portion 44 satisfy the following inequalities:

$$1.5 > \frac{W_{A1}}{W_{A2}} \geq 1;$$

$$1.5 > \frac{W_{B1}}{W_{B2}} \geq 1;$$

$$1.7 \geq \frac{W_{A1}}{W_{B1}} > 1;$$

$$1.7 \geq \frac{W_{A2}}{W_{B2}} > 1.$$

As shown in FIG. 8, for making the linear probe 40 have relatively better deformation efficiency and avoid excessive force, the height H1 of the inner space 34 is defined as the distance between the second top surface 324 and first bottom surface 315, the height H2 of the narrowest section 443 is defined as the distance between the upper end 443a and lower end 443b of the narrowest section 443, the difference between the height H1 and height H2 is defined as a height difference H3 (not shown), and the ratio of the height H1 and the height difference H3 may be larger than 3 and smaller than 20. In other words, the body portion 44 and the inner space 34 are preferably designed with the dimensions satisfying the following inequality:

$$20 > \frac{H_1}{H_3} > 3.$$

The upper and lower through holes 316, 317, 326 and 327 of the probe seat 30 are shaped as square, rectangle and so on, thereby respectively defined with a maximum side lengths L1, L2, L3 and L4 parallel to the first direction, i.e. along the Y-axis. In the configuration as shown in FIG. 2A, FIG. 3 and FIG. 8, the maximum side lengths L1, L2 and L4 of the through holes 316, 317 and 327 are equal and only a little larger than the front width $W_{A1}$ of each of the widest sections 441 and 445, for supporting the linear probe 40 and thereby the convenience for the follow-up connection of the probe head 20 with the circuit board or space transformer located above it. The maximum side length L3 of the first lower through hole 326 may be larger than the maximum side lengths L1, L2 and L4 of the through holes 316, 317 and 327 for reducing the wear of the head portion 45 and the lower die unit 32. Specifically speaking, in the case that the maximum side length L3 of the first lower through hole 326 is larger than the maximum side length L4 of the second lower through hole 327, the lower inserted section 451 of the head portion 45 is highly possible to be not abutted on the third side 321c of the first lower through hole 326 as shown in FIG. 2A and FIG. 3, or only slightly abutted on the third side 321c of the first lower through hole 326, that reduces the wear of the head portion 45 and the lower die unit 32 when the probe 40 probes. However, the present invention is unlimited thereto. The maximum side length L3 of the first lower through hole 326 may be equal to the maximum side length L4 of the second lower through hole 327, and the maximum side length L4 of the second lower through hole 327 may be larger than or equal to the maximum side lengths L1 and L2 of the first and second upper through holes 316 and 317. In other words, the dimensions of the upper and lower through holes 316, 317, 326 and 327 may satisfy the following inequalities:

$$L3 \geq L4 \geq L1;$$

$$L3 \geq L4 \geq L2.$$

In conclusion, by the dimensional design of each section of the body portion 44 of the linear probe 40 and the arrangement of the body portion 44 and the inner space 34 of the probe seat 30, the probe head 20 of the present invention is favorable to the dynamic behavior control of the linear probe 40 applied with a force. Besides, the manufacturing process of the linear probe 40 in the present invention is relatively simpler and costs relatively lower. In other words, the linear probe 40 in the present invention has the advantages of both the conventional cylindrical needle and square punched needle. In addition, the linear probe 40 in the present invention can be formed from a plate by cutting, thereby having relatively more variation in material.

Furthermore, the linear probe of the probe head of the present invention may be configured as shown in FIG. 12 to FIG. 17. The linear probes 40 as shown in FIG. 12 to FIG. 17 are similar to the above-described linear probe 40, but the linear probes 40 as shown in FIG. 12 to FIG. 17 have asymmetric tail portions. Specifically speaking, the linear probe 40 is defined with an imaginary reference surface P including the central axis A1 and perpendicular to the width axis A2, as shown in FIGS. 12-17 and FIG. 5-6. The tail portion 43 has an exposed part 434 for protruding out of the first top surface 314 of the probe seat 30, which includes the abutted section 431 and the stopping section 432 and is asymmetric with respect to the imaginary reference surface P. According to the orientation as shown in FIGS. 12-17, the part of the exposed part 434 of the tail portion 43 located on the left side of the imaginary reference surface P is asymmetric with the other part of the exposed part 434 located on the right side of the imaginary reference surface P.

By the feature that the exposed part 434 of the tail portion 43 is asymmetric with respect to the imaginary reference surface P, when the installer installs the linear probe 40 into the probe seat 30, or when the user replaces the linear probe 40, the orientation of the linear probe 40 can be recognized according to the exposed part 434 of the tail portion 43. In this way, as long as the linear probes 40 of the probe head 20 are arranged in a way that the exposed parts 434 thereof are all consistent in orientation, it is ensured that the parts of all the linear probes 40 located in probe seat 30 are also consistent in orientation. In other words, the linear probes 40 are disposed in a way that the front surfaces or back surfaces thereof are all consistent in direction, so that all the linear probes 40 are consistent in dynamic behavior when being applied with a force, thereby prevented from interference and short circuit.

Figure 12:
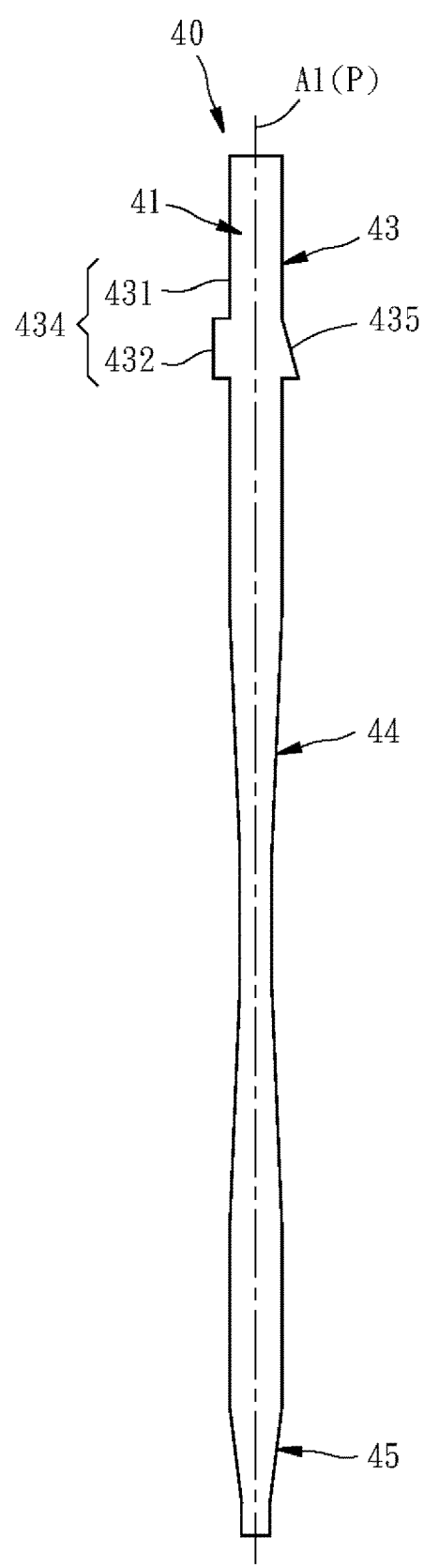
FIG. 12 to FIG. 17 are schematic front views of other types of the linear probe.
Figure 13:
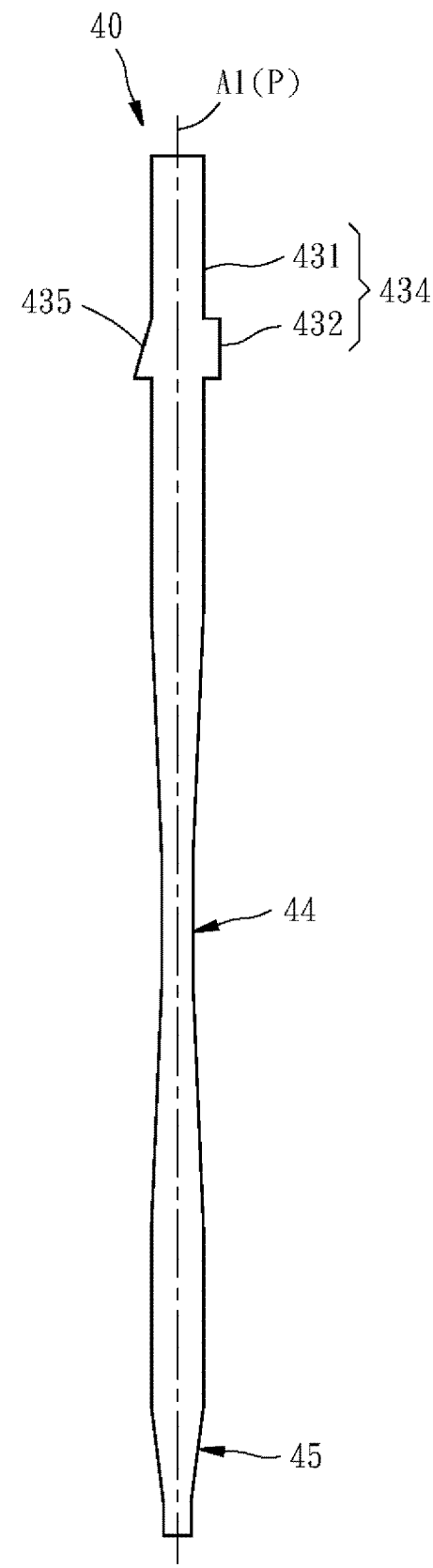
Figure 14:
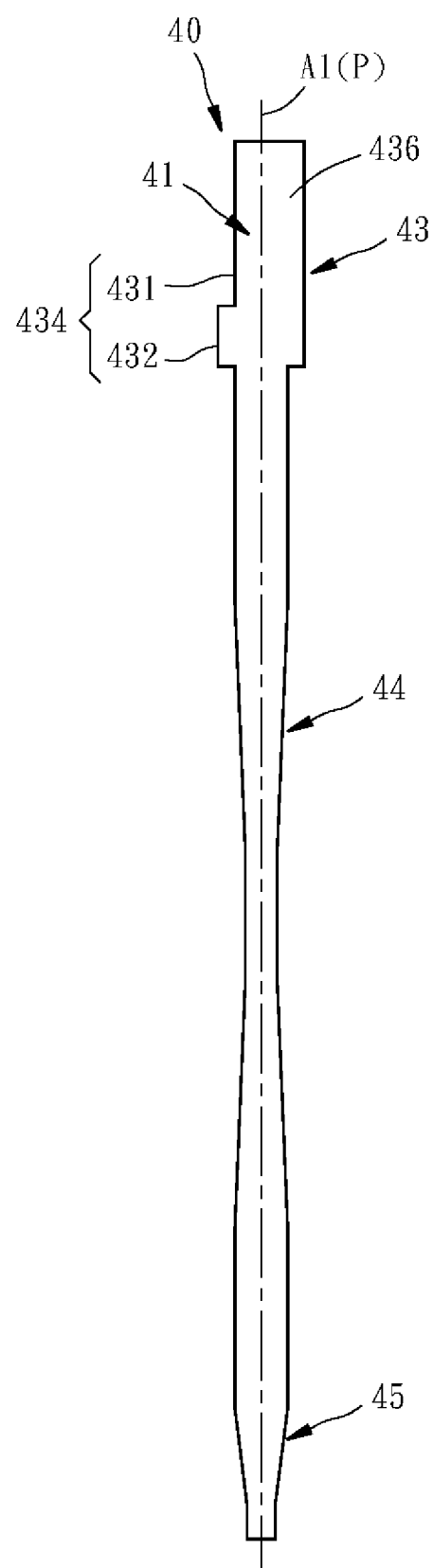
Figure 15:
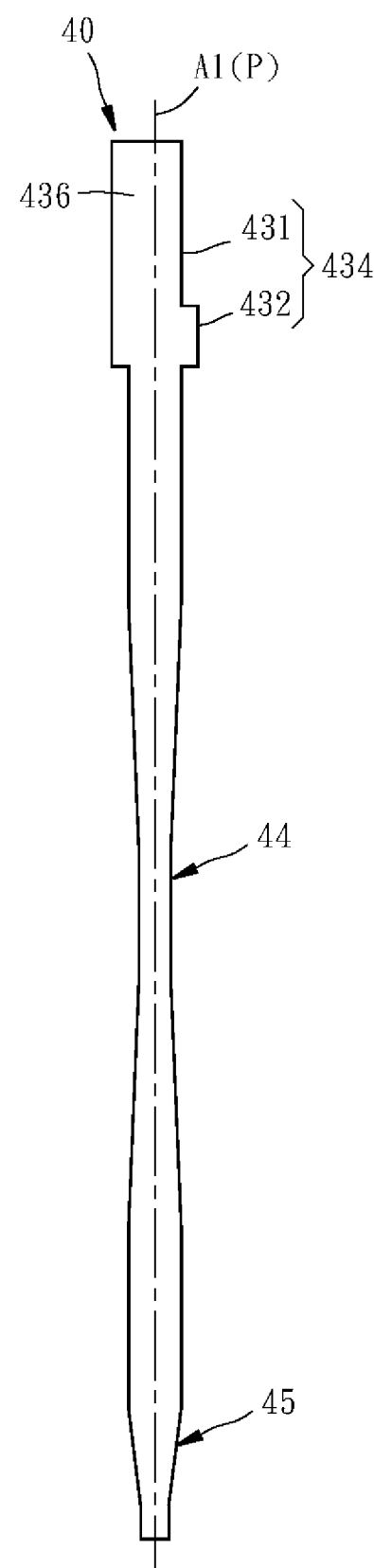
Figure 16:
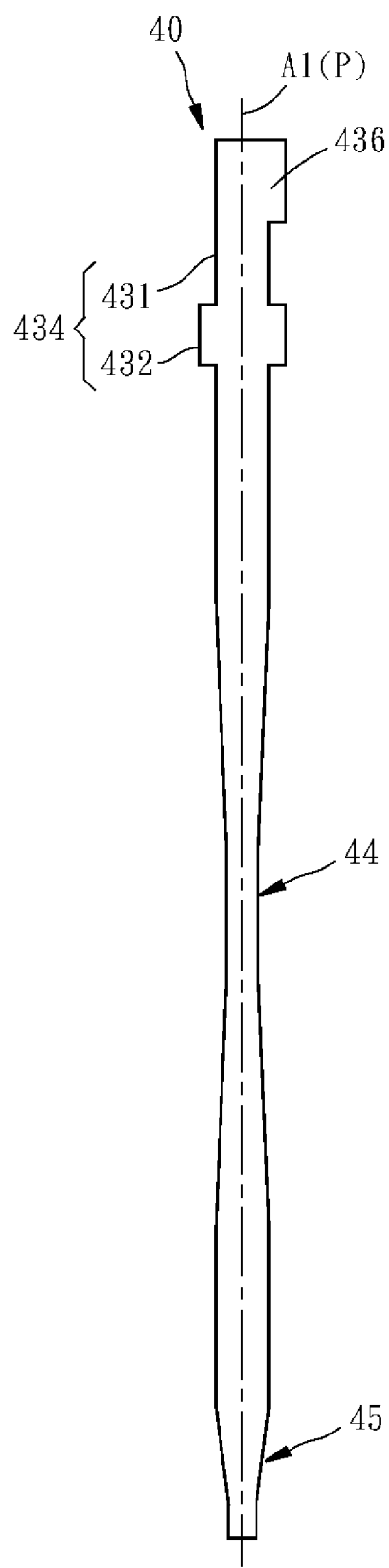
Figure 17:
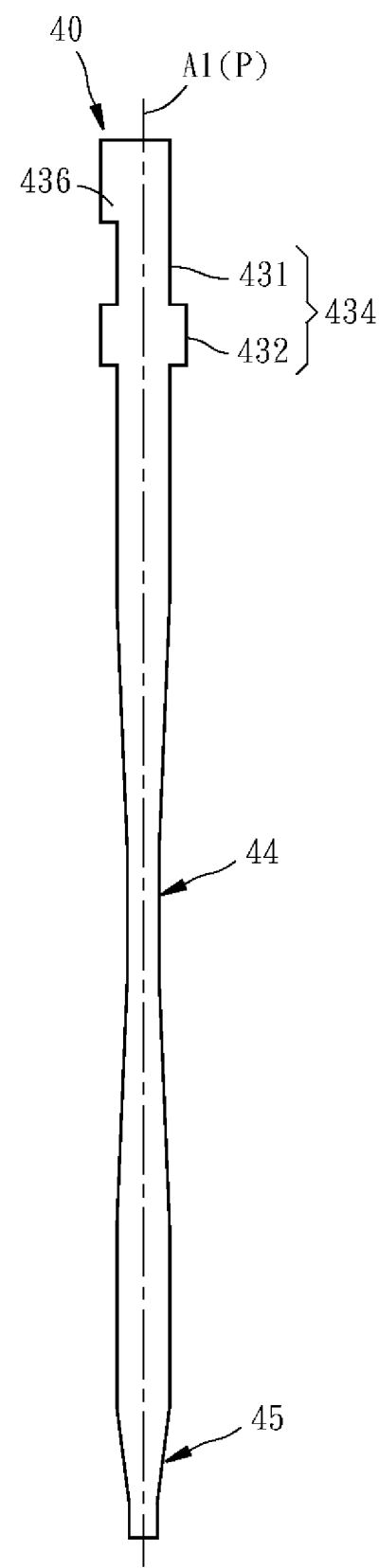

In the types as shown in FIGS. 12-17, the imaginary reference surface P is perpendicular to the width axis A2, so that the direction of the exposed part 434 of the tail portion 43 for recognition is the same with the direction of the bending deformation of the linear probe 40. According to the orientation shown in FIG. 12, the stopping section 432 of the tail portion 43 has a slope 435 extending from the bottom end of the abutted section 431 and located on the right side of the imaginary reference surface P. When the upper and lower die units 31 and 32 are offset from each other, they displace in the left and right directions in FIG. 12, so that the body portion 44 also has the bending deformation in the left and right directions in FIG. 12. Such direction recognizing manner is relatively more direct for observation. The linear probe 40 as shown in FIG. 13, which has a slope 435 orientated opposite to that in FIG. 12, also attains the above-described effect. However, the linear probe of the present invention is unlimited to the above-described design. As long as the exposed part 434 of the tail portion 43 is asymmetric with respect to an imaginary reference surface P including the central axis A1, it has the direction recognition function. The imaginary reference surface P is unlimited to be perpendicular to the width axis A2.

Figure 18:
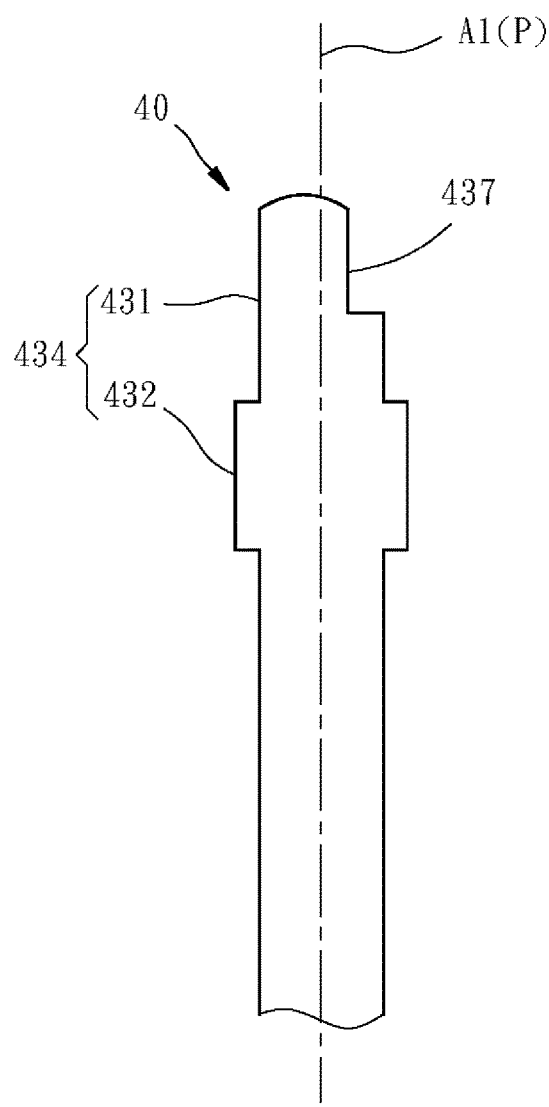
FIG. 18 and FIG. 19 are schematic partial front views of other types of the linear probe.
Figure 19:
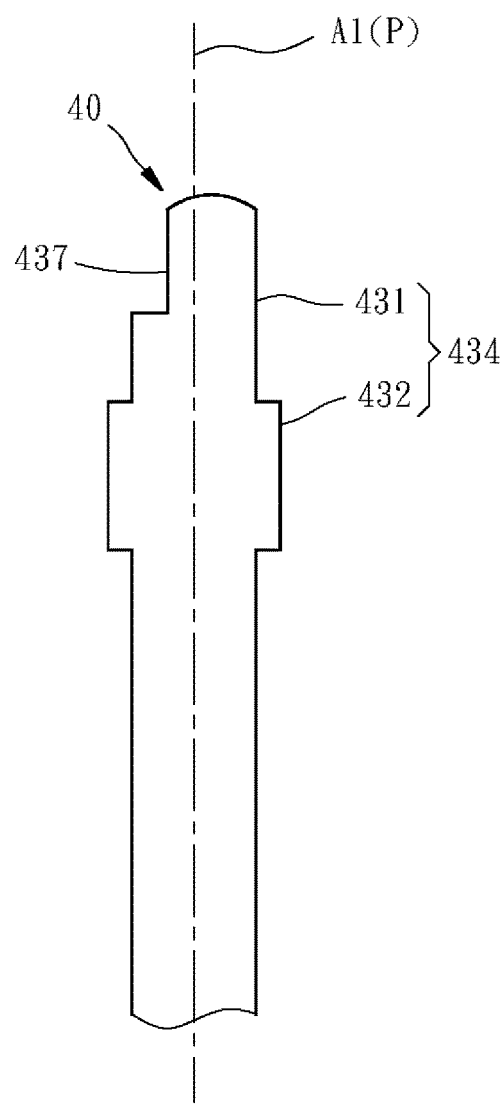

Besides, in the types as shown in FIG. 12 and FIG. 13, the abutted section 431 of the tail portion 43 is symmetric with respect to the imaginary reference surface P, and only the stopping section 432 is asymmetric with respect to the imaginary reference surface P, but the present invention is unlimited thereto. For example, for the exposed part 434 of the tail portion 43 of the linear probe 40 as shown in FIG. 14 to FIG. 17, the stopping section 432 is symmetric, and the abutted section 431 is asymmetric. In the types as shown in FIG. 14 to FIG. 17, the abutted section 431 has a protrusion 436 protruding toward a direction perpendicular to the imaginary reference surface P, wherein the protrusion 436 in FIG. 14 and FIG. 16 protrudes to the right, and the protrusion 436 in FIG. 15 and FIG. 17 protrudes to the left. In other words, in FIG. 14 and FIG. 16, the part of the abutted section 431 located on the right side of the imaginary reference surface P is more prominent than the other part of the abutted section 431 located on the left side of the imaginary reference surface P; in FIG. 15 and FIG. 17, the part of the abutted section 431 located on the left side of the imaginary reference surface P is more prominent than the other part of the abutted section 431 located on the right side of the imaginary reference surface P. The orientation of such asymmetric design also has the aforementioned advantage that the direction recognizing manner is relatively more direct for observation. Besides, the design with the asymmetric abutted section 431 of the exposed part 434 enables the installer or user to see the asymmetric part directly from the above of the linear probe 40 downwardly, thereby more convenient for the direction recognition. But such design causes the top end of the abutted section 431 a relatively larger area, that might be unfavorable to be connected to the space transformer or circuit board located above it. Alternatively, the exposed part 434 with the asymmetric abutted section 431 may be configured in a way as shown in FIG. 18 that the part of the abutted section 431 located on the right side of the imaginary reference surface P has a recess 437 located at the top end of the abutted section 431 so that the part of the abutted section 431 located on the left side of the imaginary reference surface P is relatively more prominent, or configured in another way as shown in FIG. 19 that the part of the abutted section 431 located on the left side of the imaginary reference surface P has a recess 437 located at the top end of the abutted section 431 so that the part of the abutted section 431 located on the right side of the imaginary reference surface P is relatively more prominent. Such configuration designs cause the top end of the abutted section 431 a relatively smaller area, and the asymmetric part thereof are more liable to be seen by the installer or user from the above of the linear probe 40 downwardly than that of the configuration design with the asymmetric stopping section 432. In other words, the design with the asymmetric stopping section 432 as shown in FIG. 12 and FIG. 13 causes the top end of the abutted section 431 a relatively smaller area and thereby favorable to the assembly of the probe card, the design with the asymmetric abutted section 431 as shown in FIG. 14 to FIG. 17 is relatively more convenient for direction recognition, the design as shown in FIG. 18 and FIG. 19 combines the advantages of the above two designs, and these different designs can be chosen according to requirements.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A probe head comprising:
an upper die unit having a first top surface, a first bottom surface and an upper installation hole penetrating through the first top surface and the first bottom surface;
a lower die unit having a second top surface, a second bottom surface and a lower installation hole penetrating through the second top surface and the second bottom surface, the second top surface and the first bottom surface facing each other and thereby an inner space being defined between the second top surface and the first bottom surface; and
a linear probe inserted through the upper installation hole and the lower installation hole and thereby defined with a tail portion located in the upper installation hole and protruding out of the first top surface, a head portion located in the lower installation hole and protruding out of the second bottom surface, and a body portion connecting the tail portion with the head portion, the tail portion comprising a stopping section abutted on the first top surface, the linear probe having a front surface and a back surface, which face opposite directions, and a first lateral surface and a second lateral surface, which connect the front surface with the back surface, the linear probe being defined respectively on the front surface and back surface thereof with a front width and a back width parallel to a width axis, defined with a thickness perpendicularly to the width axis, and defined with a first front included angle between the first lateral surface and the front surface, a second front included angle between the second lateral surface and the front surface, a first back included angle between the first lateral surface and the back surface, and a second back included angle between the second lateral surface and the back surface, the body portion comprising a plurality of sections comprising a narrowest section, each of the sections having the front width larger than the back width, the front width of the narrowest section being smaller than the front width of any other said section of the body portion, the head portion comprising a lower inserted section located in the lower installation hole, the lower inserted section having the front width larger than the back width;

wherein the upper installation hole is defined with a first central axis; the lower installation hole is defined with a second central axis; the first central axis is offset from the second central axis toward a first direction for a first offset value and offset from the second central axis toward a second direction perpendicular to the first direction for a second offset value smaller than the first offset value and thereby the body portion of the linear probe is curved; an inner wall of each of the upper installation hole and the lower installation hole has a first side facing toward the first direction, a second side facing toward the second direction, a third side facing toward a reverse of the first direction, and a fourth side facing toward a reverse of the second direction; the first front included angle and first back included angle of the tail portion of the linear probe are abutted on the third side and fourth side of the inner wall of the upper installation hole respectively; the second front included angle of the head portion is orientated toward an included angle between the first side and second side of the lower installation hole.

2. The probe head as claimed in claim 1, wherein a distance is provided between an upper end of the narrowest section and the first bottom surface; another distance is provided between a lower end of the narrowest section and the second top surface; the linear probe is formed from a plate by laser cutting; the linear probe is equal in thickness to the plate.

3. The probe head as claimed in claim 1, wherein the plurality of sections of the body portion of the linear probe comprise at least one widest section; the front width of the widest section is larger than the front width of any other said section of the body portion.

4. The probe head as claimed in claim 3, wherein the at least one widest section comprises a first widest section connected with the tail portion, and a second widest section connected with the head portion; the narrowest section is located between the first widest section and the second widest section.

5. The probe head as claimed in claim 4, wherein the plurality of sections of the body portion of the linear probe further comprise a gradually narrowing section and a gradually widening section; the gradually narrowing section extends with the front width gradually decreasing from the first widest section to the narrowest section; the gradually widening section extends with the front width gradually increasing from the narrowest section to the second widest section.

6. The probe head as claimed in claim 3, wherein the front width of the widest section is equal to the thickness of the widest section; the thickness of the widest section is larger than or equal to the thickness of the narrowest section.

7. The probe head as claimed in claim 3, wherein the back width of the widest section is larger than the back width of the narrowest section; a ratio of the back width of the widest section to the back width of the narrowest section is larger than 1 and smaller than or equal to 1.7.

8. The probe head as claimed in claim 3, wherein a ratio of the front width of the widest section to the front width of the narrowest section is larger than 1 and smaller than or equal to 1.7.

9. The probe head as claimed in claim 1, wherein the thickness of the narrowest section is larger than or equal to the front width of the narrowest section.

10. The probe head as claimed in claim 1, wherein a ratio of the front width to the back width of each of the sections of the body portion of the linear probe is larger than 1 and smaller than 1.5.

11. The probe head as claimed in claim 1, wherein the lower die unit comprises a first lower die having the second top surface and a second lower die having the second bottom surface; the lower installation hole comprises a first lower through hole penetrating through the first lower die and a second lower through hole penetrating through the second lower die; a maximum side length of the first lower through hole is larger than or equal to a maximum side length of the second lower through hole; the maximum side length of the second lower through hole is larger than or equal to a maximum side length of the upper installation hole; the maximum side length of the upper installation hole, the maximum side length of the first lower through hole and the maximum side length of the second lower through hole are defined parallel to the first direction.

12. The probe head as claimed in claim 1, wherein a height of the inner space is defined as a distance between the second top surface and the first bottom surface; a height of the narrowest section is defined as a distance between an upper end and a lower end of the narrowest section; a height difference is defined as a difference between the height of the inner space and the height of the narrowest section; a ratio of the height of the inner space to the height difference is larger than 3 and smaller than 20.

13. The probe head as claimed in claim 1, wherein the second lateral surface of the linear probe is formed by laser cutting and faces toward the first side of the inner wall of the upper installation hole.

14. The probe head as claimed in claim 1, wherein the tail portion of the linear probe is defined in the upper installation hole with a first position and a second position that is closer to the body portion than the first position is; the head portion of the linear probe is defined in the lower installation hole with a third position and a fourth position that is farther away from the body portion than the third position is; at the first position, the first front included angle and first back included angle are abutted on the third side and fourth side of the inner wall of the upper installation hole respectively; at the second position, the second front included angle is orientated toward an included angle between the first side and second side of the upper installation hole; at the third position, the first front included angle and first back included angle are abutted on the third side and fourth side of the inner wall of the lower installation hole respectively; at the fourth position, the second front included angle is orientated toward the included angle between the first side and second side of the inner wall of the lower installation hole; the first back included angle is larger than the first front included angle at the first position of the tail portion; the first back included angle is larger than the first front included angle at the third position of the head portion.

15. A probe head comprising:
an upper die unit having a first top surface, a first bottom surface and an upper installation hole penetrating through the first top surface and the first bottom surface;
a lower die unit having a second top surface, a second bottom surface and a lower installation hole penetrating through the second top surface and the second bottom surface, the second top surface and the first bottom surface facing each other and thereby an inner space being defined between the second top surface and the first bottom surface; and
a linear probe inserted through the upper installation hole and the lower installation hole and thereby defined with a tail portion located in the upper installation hole and protruding out of the first top surface, a head portion located in the lower installation hole and protruding out of the second bottom surface, and a body portion connecting the tail portion with the head portion, the tail portion comprising a stopping section abutted on the first top surface, the linear probe having a front surface and a back surface, which face opposite directions, and a first lateral surface and a second lateral surface, which connect the front surface with the back surface, the linear probe being defined respectively on the front surface and back surface thereof with a front width and a back width parallel to a width axis, defined with a thickness perpendicularly to the width axis, and defined with a first front included angle between the first lateral surface and the front surface, a second front included angle between the second lateral surface and the front surface, a first back included angle between the first lateral surface and the back surface, and a second back included angle between the second lateral surface and the back surface, the body portion comprising a plurality of sections comprising a narrowest section, each of the sections having the front width equal to the back width, the front width of the narrowest section being smaller than the front width of any other said section of the body portion, the head portion comprising a lower inserted section located in the lower installation hole, the lower inserted section having the front width equal to the back width;
wherein the upper installation hole is defined with a first central axis; the lower installation hole is defined with a second central axis; the first central axis is offset from the second central axis toward a first direction for a first offset value and offset from the second central axis toward a second direction perpendicular to the first direction for a second offset value smaller than the first offset value and thereby the body portion of the linear probe is curved; an inner wall of each of the upper installation hole and the lower installation hole has a first side facing toward the first direction, a second side facing toward the second direction, a third side facing toward a reverse of the first direction, and a fourth side facing toward a reverse of the second direction; the first front included angle and first back included angle of the tail portion of the linear probe are abutted on the third side and fourth side of the inner wall of the upper installation hole respectively; the second front included angle of the head portion is orientated toward an included angle between the first side and second side of the lower installation hole; the tail portion, body portion and head portion of the linear probe extend along a central axis of the linear probe in order; the linear probe is defined with an imaginary reference surface comprising the central axis; the tail portion comprises an exposed part protruding out of the first top surface; the exposed part is asymmetric with respect to the imaginary reference surface.

16. The probe head as claimed in claim 15, wherein the width axis is perpendicular to the imaginary reference surface.

17. The probe head as claimed in claim 15, wherein the exposed part of the tail portion of the linear probe comprises an abutted section located at an end of the linear probe, and the stopping section that is closer to the body portion than the abutted section is; the abutted section is asymmetric with respect to the imaginary reference surface.

18. The probe head as claimed in claim 17, wherein a part of the abutted section located on a side of the imaginary reference surface is more prominent than another part of the abutted section located on another side of the imaginary reference surface.

19. The probe head as claimed in claim 18, wherein the abutted section has a protrusion protruding in a direction perpendicular to the imaginary reference surface.

20. The probe head as claimed in claim 15, wherein the exposed part of the tail portion of the linear probe comprises an abutted section located at an end of the linear probe, and the stopping section that is closer to the body portion than the abutted section is; the abutted section is symmetric with respect to the imaginary reference surface; the stopping section is asymmetric with respect to the imaginary reference surface; the stopping section has a slope extending from a bottom end of the abutted section and located on a side of the imaginary reference surface.

* * * * *